(12) United States Patent
Senda et al.

(10) Patent No.: US 10,109,692 B2
(45) Date of Patent: Oct. 23, 2018

(54) ORGANIC LIGHT-EMITTING DISPLAY DEVICE

(71) Applicant: SAMSUNG DISPLAY CO., LTD., Yongin-si, Gyeonggi-do (KR)

(72) Inventors: Takahiro Senda, Yongin-si (KR); Jungmi Choi, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/471,691

(22) Filed: Mar. 28, 2017

(65) Prior Publication Data
US 2017/0287994 A1    Oct. 5, 2017

(30) Foreign Application Priority Data

Mar. 29, 2016    (KR) .................... 10-2016-0037866

(51) Int. Cl.
*H01L 27/00*    (2006.01)
*H01L 27/32*    (2006.01)
*H01L 51/52*    (2006.01)

(52) U.S. Cl.
CPC ...... *H01L 27/3246* (2013.01); *H01L 27/3216* (2013.01); *H01L 27/3258* (2013.01); *H01L 27/3262* (2013.01); *H01L 27/3265* (2013.01); *H01L 27/3276* (2013.01); *H01L 51/5218* (2013.01); *H01L 51/5228* (2013.01); *H01L 51/5234* (2013.01)

(58) Field of Classification Search
CPC .................................................. H01L 27/3246
See application file for complete search history.

(56) References Cited

U.S. PATENT DOCUMENTS

| | | | |
|---|---|---|---|
| 7,221,095 B2 | 5/2007 | Yamazaki et al. |
| 7,701,132 B2 | 4/2010 | Oh |
| 9,099,674 B2 | 8/2015 | Ha et al. |
| 2008/0143247 A1 | 6/2008 | Kim et al. |

FOREIGN PATENT DOCUMENTS

| | | |
|---|---|---|
| KR | 10-2006-0059722 | 6/2006 |
| KR | 10-2008-0055243 | 6/2008 |
| KR | 10-2011-0095653 | 8/2011 |

*Primary Examiner* — William Harriston
(74) *Attorney, Agent, or Firm* — Lee & Morse, P.C.

(57) ABSTRACT

An organic light-emitting display device includes a pixel including a first region to display an image, a second region to transmit external light, and a third region between the first region and the second region. The pixel includes a pixel electrode in the first region, a pixel-defining layer in at least the first region, an auxiliary electrode in at least the third region, and an intermediate layer on the pixel electrode. The pixel-defining layer includes a first opening exposing a portion of the pixel electrode and a second opening corresponding to at least the second region and third region. The pixel electrode is exposed via the first opening, and the intermediate layer includes an organic emission layer. An opposite electrode is on the intermediate layer and contacts the auxiliary electrode in the third region.

20 Claims, 6 Drawing Sheets

ORGANIC LIGHT-EMITTING DISPLAY DEVICE

CROSS-REFERENCE TO RELATED APPLICATION

Korean Patent Application No. 10-2016-0037866, filed on Mar. 29, 2016, and entitled, "Organic Light Emitting Display Device," is incorporated by reference herein in its entirety.

BACKGROUND

1. Field

One or more embodiments relate to an organic light-emitting display device.

2. Description of the Related Art

An organic light-emitting display includes a plurality of pixels that emit light to form an image. Each pixel may include a pixel circuit and an organic light-emitting diode. The diode includes an organic emission layer between two electrodes. The pixel circuit includes thin film transistors and a capacitor for driving the organic light-emitting diode. The transistors include a switching transistor and a driving transistor. In operation, electron and holes injected from the electrodes recombine in the organic emission layer to form excitons. Light is emitted when the excitons change state and release energy.

An organic light-emitting display has a variety of benefits. For example, an organic light-emitting display is a self-luminous and therefore does not require a separate light source like some other displays. Also, an organic light-emitting display is driven at relatively low voltage and has a lightweight slim profile, excellent characteristics with respect to viewing angle and contrast, and fast response speed. Because of these benefits, an organic light-emitting display is the display of choice in many personal mobile apparatuses, including but not limited to MP3 players, mobile phones, and televisions.

Recently, transparent organic light-emitting displays have been developed.

SUMMARY

In accordance with one or more embodiments, an organic light-emitting display device includes a substrate; and a pixel over the substrate and including a first region to display an image, a second region to transmit external light, and a third region between the first region and the second region, wherein the pixel includes: a pixel electrode in the first region; a pixel-defining layer in at least the first region and including a first opening and a second opening, the first opening exposing a portion of the pixel electrode and the second opening corresponding to at least the second region and the third region; an auxiliary electrode in at least the third region; an intermediate layer on the pixel electrode exposed via the first opening, the intermediate layer including an organic emission layer and an opposite electrode on the intermediate layer and contacting the auxiliary electrode in the third region.

The opposite electrode may directly contact the auxiliary electrode exposed via the second opening of the pixel-defining layer in the third region. The auxiliary electrode and the pixel electrode may be in a same layer and may include a same material. The pixel may include a fourth region between the first region and the second region, wherein the auxiliary electrode extends from the third region to at least a portion of the fourth region and at least the portion of the auxiliary electrode which corresponds to the fourth region is covered by the pixel-defining layer.

The display device may include a conductive layer spaced apart from at least a portion of the auxiliary electrode in a fourth region with a via insulating layer therebetween, wherein the auxiliary electrode is connected to the conductive layer via a contact hole of the via insulating layer. At least a portion of the auxiliary electrode in the fourth region, at least a portion of the conductive layer, and the contact hole may overlap one another. At least portion of the auxiliary electrode in the fourth region may be between the via insulating layer and the pixel-defining layer.

The via insulating layer may include an opening corresponding to the second region and at least a portion of the third region, and the auxiliary electrode may extend from the fourth region to the third region along an edge of the opening of the via insulating layer. The pixel electrode may be a reflective electrode, and the opposite electrode may be a transparent or semi-transparent electrode.

A ratio of an area of the second region to an entire area of the pixel may be about 40% to about 90%. A ratio of an area of the third region to an area of the second region may be about 0.5% or less. The driver may be in the first region and may be electrically connected to the pixel electrode, wherein the driver may drive the pixel and includes at least one thin film transistor and at least one capacitor. The at least one capacitor may includes an upper electrode facing a lower electrode and an insulating layer therebetween, and the via insulating layer may cover the upper electrode.

The intermediate layer may include a common layer, and the common layer may be over an entire region of the pixel, except at least a portion of the third region of the pixel. The pixel may include a first sub-pixel, a second sub-pixel, and a third sub-pixel to respectively emit light of different colors, and the pixel electrode may include a first pixel electrode, a second pixel electrode, and a third pixel electrode respectively arranged in the first sub-pixel, second sub-pixel, and third sub-pixel in an island form.

The first sub-pixel, second sub-pixel, and third sub-pixel may respectively emit red light, green light, and blue light, and the first sub-pixel, the second sub-pixel, and the third sub-pixel may respectively have different areas. The third region may be adjacent to a pixel electrode having a smallest area from among the first pixel electrode, the second pixel electrode, and the third pixel electrode.

In accordance with one or more embodiments, an organic light-emitting display device includes a substrate; and a pixel over the substrate and including a first region to display an image, a second region to transmit external light, a third region between the first region and the second region, and a fourth region between the first region and the third region, wherein the pixel includes: a pixel electrode in the first region; a pixel-defining layer in at least the first region and including a first opening and a second opening, the first opening exposing a portion of the pixel electrode and the second opening corresponding to at least the second region and the third region; an auxiliary electrode in the third region and the fourth region; a conductive layer in the fourth region, spaced apart from the auxiliary electrode with a via insulating layer therebetween, and connected to the auxiliary electrode via a contact hole of the via insulating layer; an intermediate layer on the pixel electrode exposed via the first opening, the intermediate layer including an organic emission layer and an opposite electrode on the intermediate layer and contacting the auxiliary electrode exposed via the second opening in the third region.

A portion of the auxiliary electrode corresponding to the fourth region may be between the via insulating layer and the pixel-defining layer. The via insulating layer may include an opening corresponding to the second region and at least a portion of the third region, and the auxiliary electrode may extend from the fourth region to the third region along an edge of the opening of the via insulating layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
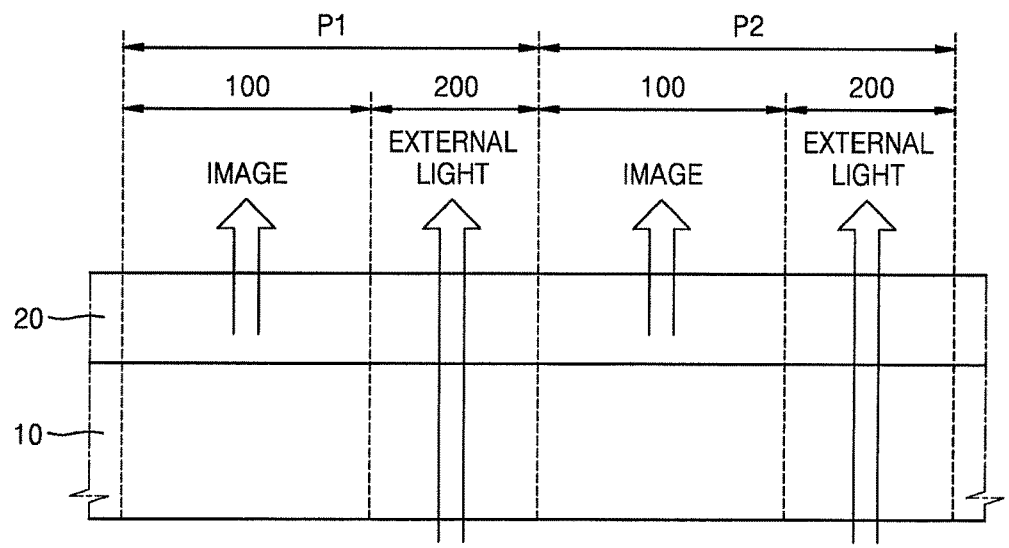
FIG. 1 illustrates an embodiment of an organic light-emitting display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates a cross-sectional view of an embodiment of an organic light-emitting display device. Referring to FIG. 1, the organic light-emitting display device includes a display unit 20 on a substrate 10. The display unit 20 includes plurality of pixels P1 and P2. Each of the pixels P1 and P2 includes a first region 100 emitting light and a second region 200 transmitting external light. The external light may correspond to external light incident to the organic light-emitting display device. External light incident to one surface of the organic light-emitting display device may pass into the substrate 10 and the display unit 20, may pass through another surface facing the one surface of the organic light-emitting display device, and may then be recognized by a user.

In one embodiment, a user on one side that displays an image may observe an image outside the substrate 10. FIG. 1 illustrates a top-emission display device which displays an image of the display unit 20 in a direction opposite to the substrate 10. In another embodiment, the organic light-emitting display device may be a bottom-emission display device which displays an image of the display unit 20 in the direction of the substrate 10. In another embodiment, the organic light-emitting display device may be a dual-emission display device which displays an image of the display unit 20 in the direction of the substrate 10 and the opposite direction of the substrate 10.

In FIG. 1, the first pixel P1 and the second pixel P2 are adjacent pixels of the organic light-emitting display device. Each of the pixels P1 and P2 includes a first region 100 and a second region 200. The first region 100 of the display unit 20 displays an image. The second region 200 transmits external light. The second region 200 may be in each of the pixels P1 and P2, or may be arranged such that the second region 200 is connected between the pixels P1 and P2. Each of the pixels P1 and P2 may include a plurality of sub-pixels.

Elements including opaque metal (e.g., a thin film transistor (TFT), a capacitor, and an organic light-emitting device (OLED)) are not in the second region 200. This configuration may increase external light transmittance in the second region 200.

Figure 2:
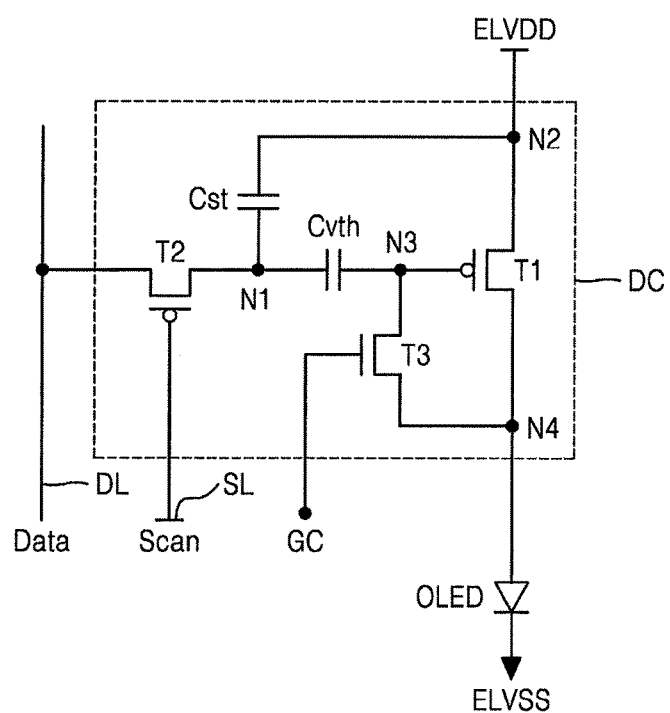
FIG. 2 illustrates an embodiment of a sub-pixel.

FIG. 2 illustrates an embodiment of a sub-pixel of the organic light-emitting display device. The organic light-emitting display device may include a plurality of pixels displaying an image. Each pixel may include a plurality of sub-pixels that respectively emit light of different colors. Each sub-pixel may include a driving circuit unit DC for driving the OLED. The driving circuit unit DC may include at least one TFT and at least one capacitor. The at least one TFT and/or the at least one capacitor may be electrically connected to a plurality of wirings SL, DL, and PL, that respectively apply a scan signal Scan, a data signal Data, and a driving voltage ELVDD to the driving circuit unit DC. In one embodiment, the driving circuit unit DC includes three TFTs T1, T2, and T3, and two capacitors Cst and Cvth. The driving circuit unit DC may include a different number of transistors and/or capacitors in another embodiment.

The transistors may include a driving TFT T1, a switching TFT T2, and a compensation TFT T3. The capacitors may include a storage capacitor Cst and a compensation capacitor Cvth.

The switching TFT 12 includes a gate electrode connected to the scan line SL, a source electrode connected to the data line DL, and a drain electrode connected to a first node N1. When the switching TFT T2 is turned on, a data signal Data is transferred from the data line DL to the first node N1 based on a scan signal Scan from the scan line SL.

The driving TFT T1 includes a gate electrode connected to a third node N3, a source electrode connected to a first driving voltage line ELVDD for supplying a first driving voltage, and a drain electrode connected to a pixel electrode 130 (e.g., see FIG. 4) of the OLED. The driving TFT T1 may be turned on or off and may control a current supplied to the OLED based on a voltage of the third node N3.

The compensation TFT T3 includes a gate electrode connected to a compensation control line GC for supplying a compensation control signal, a drain electrode connected to the third node N3, and a source electrode connected to a fourth node N4, that is, pixel electrode 130 (e.g., see FIG. 4) of the OLED and the drain electrode of the driving TFT T1. When the compensation TFT T3 is turned on based on a compensation control signal applied to the gate electrode of the compensation TFT T3, the driving TFT T1 is diode-connected via the compensation TFT T3.

The compensation capacitor Cvth is connected between the first node N1 and the third node N3. The storage capacitor Cst is connected between the first node N1 and a second node N2. The storage capacitor Cst may store a voltage corresponding to a voltage difference between the first node N1 and the second node N2, and may maintain the stored voltage for a predetermined time. The compensation capacitor Cvth may compensate for a threshold voltage Vth of the driving TFT T1 in cooperation with the compensation TFT T3.

The pixel electrode 130 (e.g., see FIG. 4) of the OLED is connected to the driving circuit unit DC. An opposite electrode 150 (e.g., see FIG. 4) is connected to a second driving voltage line ELVSS to which a second driving voltage is applied. The OLED emits light having predetermined brightness based on current from the driving circuit unit DC. In an embodiment, the OLED may emit, for example, red, green, blue, or white light.

According to an embodiment, an organic light-emitting display device may be a top-emission display device. In this case, since light passes through the opposite electrode 150 (e.g., see FIG. 4) and is emitted to outside, the opposite electrode 150 may be very thin. Therefore, the resistance of the opposite electrode 150 may increase. As a result, a voltage drop value (IR drop) may increase and second driving voltages respectively applied to the pixels may change depending on the locations of the pixels of the organic light-emitting display device. The voltage drop may cause an error in the brightness value of the pixel. As a result, uniformity of an image displayed by the organic light-emitting display device may deteriorate.

Figure 4:
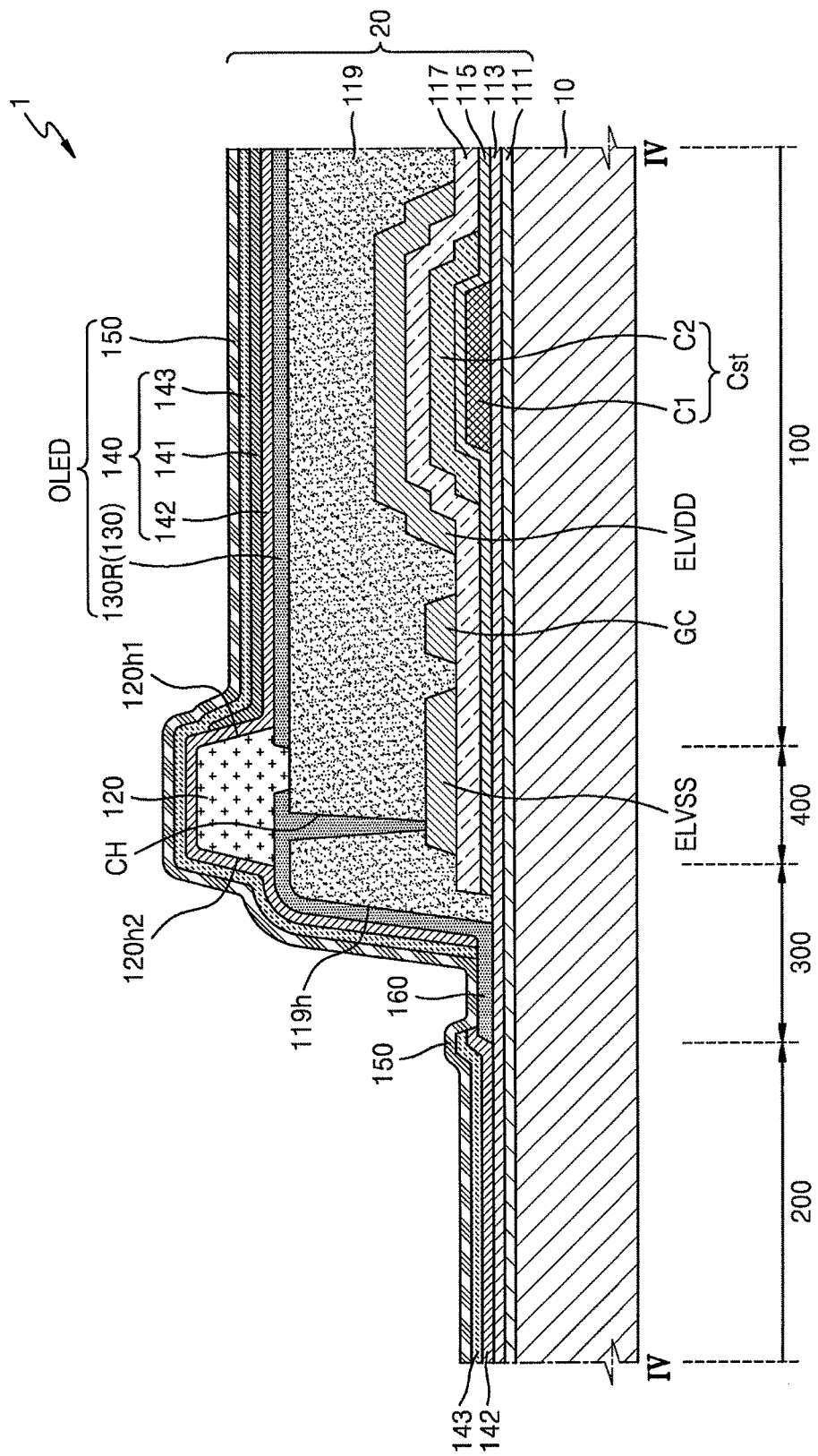
FIG. 4 illustrates a view taken along section line IV-IV in FIG. 3.

According to an embodiment, each or at least a portion of the pixels include a region in which the opposite electrode 150 is connected to the second driving voltage line ELVSS via an auxiliary electrode 160 (e.g., see FIG. 4). As a result, a reduction in the deterioration of uniformity of an image by the voltage drop may occur. The first to third TFTs T1 to T3 may be p-channel field effect transistors, n-channel field effect transistors, or a combination thereof.

Figure 3:
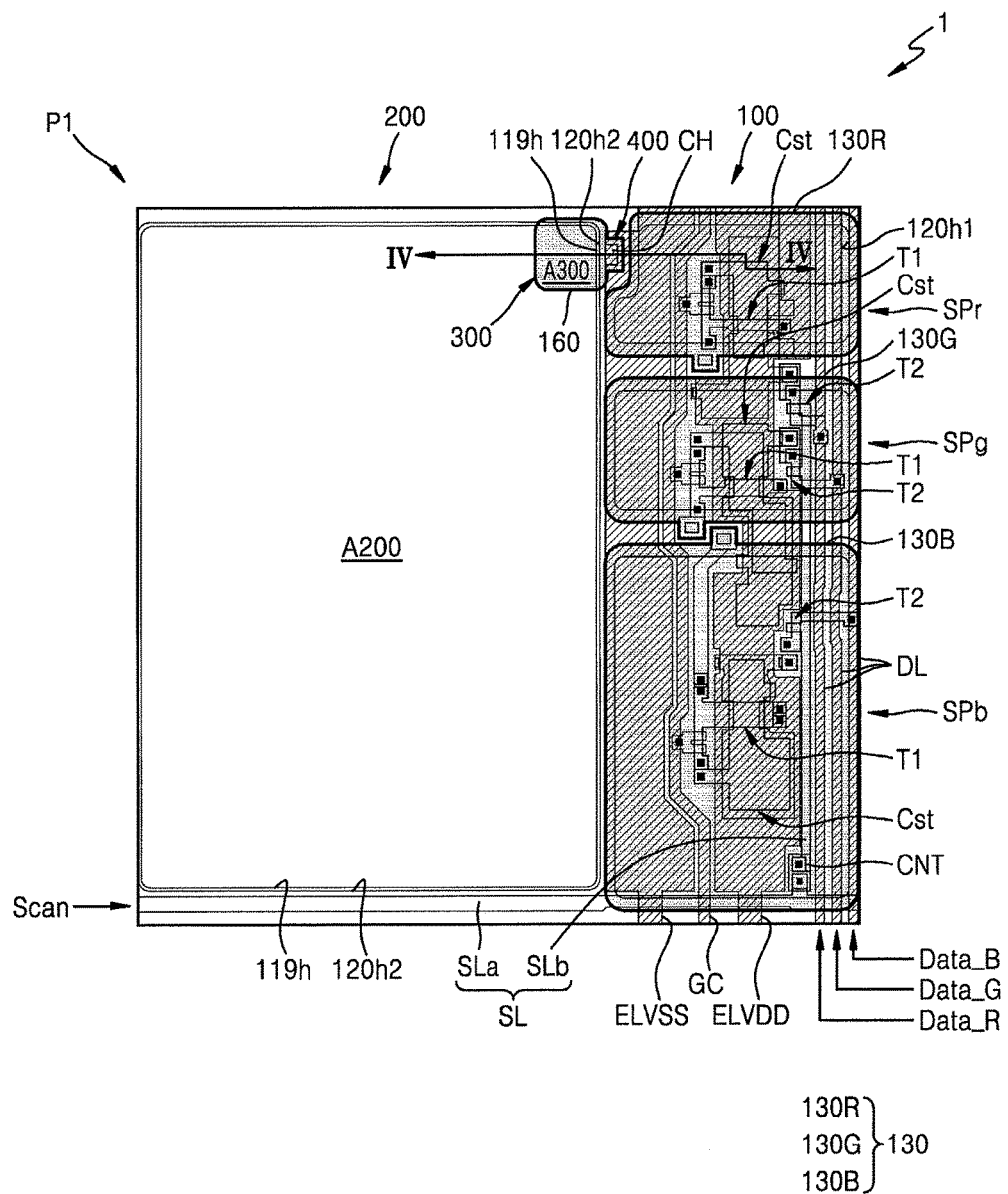
FIG. 3 illustrates an embodiment of a pixel.

FIG. 3 illustrates an embodiment of a pixel which is representative of a plurality of pixels in an organic light-emitting display device. FIG. 4 illustrates a cross-sectional view of an embodiment of a pixel taken along line IV-IV in FIG. 3.

Referring to FIGS. 3 and 4, the organic light-emitting display device 1 includes the pixel P1 over the substrate 10. The pixel P1 includes the first region 100 to emit light for displaying an image, a second region 200 for transmitting external light, and a third region 300 between the first region 100 and the second region 200. The pixel P1 includes a pixel electrode 130, a pixel-defining layer 120, an intermediate layer 140, an auxiliary electrode 160, and an opposite electrode 150. The pixel electrode 130 is in the first region 100. The pixel-defining layer 120 is in at least the first region 100 and includes a first opening 120h1 exposing a portion of the pixel electrode 130 and a second opening 120h2 corresponding to at least the second region 200 and the third region 300. The auxiliary electrode 160 is in at least the third region 300. The intermediate layer 140 is on the pixel electrode 130 exposed via the first opening 120h1. The intermediate layer 140 includes an organic emission layer 141 and an opposite electrode 150 on the intermediate layer 140 and contacting the auxiliary electrode 160 in the third region 300.

A first sub-pixel SPr, a second sub-pixel SPg, and a third sub-pixel SPb respectively emit light of different colors and may be in the first region 100. For example, the first sub-pixel SPr, the second sub-pixel SPg, and the third sub-pixel SPb may respectively emit light of predetermined colors, including but not limited to red, green, and blue light.

Each of the first sub-pixel SPr, the second sub-pixel SPg, and the third sub-pixel SPb may be driven by the driving circuit unit DC of FIG. 2. According to an embodiment, at least a portion of the driving circuit unit DC may overlap pixel electrodes 130R, 130G, and 130B respectively of the first sub-pixel SPr, the second sub-pixel SPg, and the third sub-pixel SPb in plan view. Since at least portion of the driving circuit unit DC is between the substrate 10 and the pixel electrode 130, an aperture ratio and the transmittance of the organic light-emitting display device may improve.

According to an embodiment, the first sub-pixel SPr, the second sub-pixel SPg, and the third sub-pixel SPb may be in a first direction. At least one wiring may extend in a second direction crossing the first direction. The wiring may be the scan line, the data line, and/or a power line. According to an embodiment, the wiring extending in the second direction may be the scan line SL for transferring a scan signal Scan. The scan line SL may include a first portion SLa and a second portion SLb. The first portion SLa may be adjacent to the first region 100 and the second region 200 and may extend in the second direction. The second portion SLb may be in the first region 100 and may extend in the first direction. The first portion SLa and the second portion SLb of the scan line SL may be in different layers and may be electrically connected to each other via a contact hole CNT.

According to an embodiment, the data lines DL respectively apply data signals Data_R, Data_G, and Data_B to the first sub-pixel SPr, the second sub-pixel SPg, and the third sub-pixel SPb. The first driving voltage line ELVDD applies the first driving voltage. The second driving voltage line ELVSS applies the second driving voltage. The compensation control line GC applies a compensation signal, may be in the first region 100, and may extend in the first direction. The data lines DL, the first driving voltage line ELVDD, the second driving voltage line ELVSS, and the compensation control line GC may extend and cross the first sub-pixel SPr, the second sub-pixel SPg, and the third sub-pixel SPb in the first direction.

The second region 200 is a transparent region, in which external light incident to one surface of the substrate 10 passes through the organic light-emitting display device 1 and is recognized by a user. A reflective electrode, an opaque wiring, etc., may not be in the second region 200. The second region 200 may be defined by an opaque wiring or an opaque electrode. According to an embodiment, the second region 200 may be between an opaque region and another opaque region spaced apart from the opaque region. Also, the second region 200 may be a region in which the pixel electrode 130 and the auxiliary electrode 160 are not arranged.

According to an embodiment, the third region 300 may be between the first region 100 and the second region 200 and may include the auxiliary electrode 160. The auxiliary electrode 160 may be in the same layer in which the pixel electrode 130 is arranged and may include the same material as the pixel electrode 130. For example, the third region 300 may be an opaque region. The third region 300 may be inside the second opening 120h2 of the pixel-defining layer 120. The auxiliary electrode 160 may extend from the third region 300 to a fourth region 400, in which the pixel-defining layer 120 is arranged. The auxiliary electrode 160 may be covered with the pixel-defining layer 120 in the fourth region 400 and be exposed via the second opening 120h2 in the third region 300. The auxiliary electrode 160 is exposed via the second opening 120h2 in the third region 300 and may directly contact the opposite electrode 150.

A ratio of an area A200 of the second region 200 to the entire area of one pixel P1 may be, for example, about 40% to about 90%. When the area A200 of the second region 200 is less than about 40%, the ratio of a high transmittance region for external light in the organic light-emitting display device 1 reduces. Thus, it may be difficult to operate the organic light-emitting display device 1 as a transparent display device. As the area A200 of the second region 200 increases, the transmittance of the organic light-emitting display device 1 may increase. However, since the area of the first region 100 for displaying an image should be secured, the area of the second region 200 in one pixel P1 may not exceed about 90%.

According to an embodiment, the ratio of an area A300 of the third region 300 to the area A200 of the second region 200 may be, for example, about 0.5% or less. Since the third region 300 is a region in which the auxiliary electrode 160 contacts the opposite electrode 150 and since the auxiliary electrode 160 includes an opaque material, the transmittance of the organic light-emitting display device 1 may be reduced when the third region 300 exceeds about 0.5%.

According to an embodiment, the third region 300 may be inside the second opening 120h2 of the pixel-defining layer 120, in order to not reduce the area occupied by the pixel electrode 130, that is, the aperture ratio of the organic light-emitting display device 1. Therefore, as the third region 300 increases, the transmittance of the organic light-emitting display device 1 may be reduced. According to an embodiment, reduction in the transmittance may be reduced or minimized without reducing the aperture ratio of the organic light-emitting display device 1. This may be accomplished, for example, by setting a ratio of the area A300 of the third region 300 to the area A200 of the second region 200 to about 0.5% or less.

According to an embodiment, the first pixel electrode 130R, the second pixel electrode 130G, and the third pixel electrode 130B, that are respectively in the first sub-pixel SPr, the second sub-pixel SPg, and the third sub-pixel SPb, may have different areas. The third region 300 may be in a region adjacent to the first sub-pixel SPr of the first region 100. The fourth region 400 may be between the third region 300 and the first region 100. The auxiliary electrode 160 may be connected to the conductive layer ELVSS below the auxiliary electrode 160 in the fourth region 400. According to an embodiment, the conductive layer ELVSS may be the second power voltage line ELVSS. In order to secure the fourth region 400, the first pixel electrode 130R may have an area less than that of the second pixel electrode 130G.

FIG. 4 illustrates an embodiment of a cross-sectional structure of one pixel taken along a line IV-IV of FIG. 3. Referring to FIG. 4, a buffer layer 111 may be on the substrate 10. The substrate 10 may include, for example, glass or plastic. The buffer layer 111 may include a single layer or a multi (e.g., double) layer including, for example, an inorganic material such as SiNx and/or $SiO_2$. The buffer layer 111 may block penetration of impurity elements via the substrate 10 and planarize the surface of the substrate 10.

The driving circuit unit DC (e.g., see FIG. 2) may include one or more TFTs T1, T2, and T3 (e.g., see FIG. 2) and one or more capacitors Cst and Cvth (e.g., see FIG. 2). The data line DL apply data signals DATA_R, DATA_G, and DATA_B to the driving circuit unit DC, the first power voltage line ELVDD, the compensation control line GC, and the second power voltage line ELVSS. One or more of these lines may be over the buffer layer 111 corresponding to the first region 100.

The storage capacitor Cst is illustrated from among elements of the driving circuit unit DC (e.g., see FIG. 2). The storage capacitor Cst may include a lower electrode C1 on a first insulating layer 113 and an upper electrode C2 facing the lower electrode C1, with a second insulating layer 115 therebetween. The lower electrode C1 and the upper electrode C2 may include a single layer or a multi-layer including at least one of Al, Pt, Pd, Ag, Mg, Au, Ni, Nd, Ir, Cr, Li, Ca, Mo, Ti, W, or Cu. According to an embodiment, the lower electrode C1 and the upper electrode C2 may be a single layer including Mo or multiple (e.g., triple) layers including Mo/Al/Mo. A third insulating layer 117 may be on the upper electrode C2.

Each of the first insulating layer 113, the second insulating layer 115, and the third insulating layer 117 may be a single layer or a multi (e.g., double) layer including an inorganic material such as SiNx and/or $SiO_2$. At least one of the first insulating layer 113, the second insulating layer 115, and the third insulating layer 117 may include an opening corresponding to the second region 200 and the third region 300.

The first driving voltage line ELVDD, the compensation control line GC, and the second driving voltage line ELVSS may be on the third insulating layer 117. For example, the first driving voltage line ELVDD, the compensation control line GC, and the second driving voltage line ELVSS may be in the same layer and may include the same material. The first driving voltage line ELVDD, the compensation control line GC, and the second driving voltage line ELVSS may be a single layer or a multi-layer including at least one of Al, Pt, Pd, Ag, Mg, Au, Ni, Nd, Ir, Cr, Li, Ca, Mo, Ti, W, or Cu. According to an embodiment, the first driving voltage line ELVDD, the compensation control line GC, and the second driving voltage line ELVSS may be multi (e.g., triple) layers including Mo/A/Mo or Ti/Al/Ti.

A via insulating layer 119 may cover the first driving voltage line ELVDD and the compensation control line GC, and the second driving voltage line ELVSS, and may be over the third insulating layer 117. The via insulating layer 119 may include, for example, an organic material to planarize a step difference by the driving circuit unit DC (e.g., see FIG. 2).

The second driving voltage line ELVSS may extend from the first region 100 to the fourth region 400 between the first region 100 and the third region 300. The via insulating layer 119 may include a contact hole CH corresponding to the fourth region 400. The contact hole CH may be an opening connecting a portion of the auxiliary electrode 160 corresponding to the fourth region 400 to the second driving voltage line ELVSS.

The via insulating layer 119 may include an opening 119h corresponding to at least the second region 200 and the third region 300, and may improve the transmittance of the second region 200.

The OLED may be on the via insulating layer 119 corresponding to the first region 100. The OLED includes the pixel electrode 130R, the opposite electrode 150 facing the pixel electrode 130R, and the intermediate layer 140 between the pixel electrode 130R and the opposite electrode 150. The intermediate layer 140 includes the organic emission layer 141. The pixel electrode 130R may be electrically connected to the driving circuit unit DC (e.g., see FIG. 2) via an opening of via insulating layer 119.

Edges of the pixel electrode 130R are covered with the pixel-defining layer 120. The pixel-defining layer 120 may include the first opening 120$h$1 exposing a portion of the pixel electrode 130R and the second opening 120$h$2 which corresponds to the second region 200 and the third region 300. The pixel electrode 130R may be, for example, a reflective electrode and may include at least one reflective layer including Ag, Mg, Al, Pt, Pd, Au, Ni, Nd, Ir, Cr, or a compound thereof. According to an embodiment, the pixel electrode 130R may further include a transparent or semi-transparent electrode layer on and/or under the reflective layer.

The auxiliary electrode 160 may be in the third region 300 and the fourth region 400, may be arranged in the same layer in which the pixel electrode 130R is arranged, and may include the same material as the pixel electrode 130R. The first region 100 may correspond to a region in which the pixel electrode 130R is arranged. The third region 300 may correspond to a region in which the auxiliary electrode 160 is arranged from among an inner region of the second opening 120$h$2 of the pixel-defining layer 120. The fourth region 400 may be a region between the first region 100 and the third region 300.

The auxiliary electrode 160 may be in the third region 300 and the fourth region 400. A portion of the auxiliary electrode 160 corresponding to the fourth region 400 is covered with the pixel-defining layer 120. A portion of the auxiliary electrode 160 corresponding to the third region 300 may be exposed via the second opening 120$h$2 of the pixel-defining layer 120.

The portion of the auxiliary electrode 160 corresponding to the fourth region 400 may be between the via insulating layer 119 and the pixel-defining layer 120. The auxiliary electrode 160 may extend from the fourth region 400 to the third region 300 along an edge of the opening 119$h$ of the via insulating layer 119.

The second power voltage line ELVSS may be below the portion of the auxiliary electrode 160 corresponding to the fourth region 400. The auxiliary electrode 160 may be connected to the second power voltage line ELVSS via the contact hole CH of the via insulating layer 119. For example, at least a portion of the auxiliary electrode 160, the contact hole CH of the via insulating layer 119, and at least a portion of the second power voltage line ELVSS may overlap one another in plan view.

The intermediate layer 140 including the organic emission layer 141 may be over a region exposed via the first opening 120$h$1 of the pixel electrode 130R. The intermediate layer 140 may include the organic emission layer 141, a first common layer 142, and a second common layer 143. The first common layer 142 may be between the pixel electrode 130R and the organic emission layer 141. The second common layer 143 may be between the organic emission layer 141 and the opposite electrode 150. The first common layer 142 and the second common layer 143 may be common to all pixels.

The first common layer 142 may include a hole injection layer (HIL) and/or a hole transport layer (HTL). The second common layer 143 may include an electron transport layer (ETL) and/or an electron injection layer (EIL).

The first common layer 142, the second common layer 143, and the opposite electrode 150 may be in the first region 100, the second region 200, and the fourth region 400. The first common layer 142, the second common layer 143, and the opposite electrode 150 are layers common to all pixels of the organic light-emitting display device 1 and may have high transmittance. Thus. these layers may be arranged over the entire region of the organic light-emitting display device 1. In one embodiment, at least one of the first common layer 142, the second common layer 143, or the opposite electrode 150 may include an opening corresponding to the second region 200.

According to an embodiment, the first common layer 142 and the second common layer 143 may not be in at least a portion of the third region 300. The third region 300 is a region connecting the opposite electrode 150 to the auxiliary electrode 160 in order to reduce a voltage drop. The first common layer 142 and the second common layer 143 on at least a portion of the auxiliary electrode 160 may be removed by using a laser, etc.

The auxiliary electrode 160 may be connected to the opposite electrode 150 by removing at least a portion of the first common electrode 142 and the second common electrode 143 corresponding to the third region 300, and then forming the opposite electrode 150. The first common electrode 142 and the second common electrode 143 may be, for example, over the entire region of the pixel P1 except at least portion of the first common electrode 142 and the second common electrode 143 corresponding to the third region 300.

The opposite electrode 150 may be a transparent or semi-transparent electrode, may include at least one of Ag, Al, Mg, Li, Ca, Cu, LiF/Ca, LiF/Al, MgAg, or CaAg, and may include a thin layer having a thickness ranging, for example, from about several nm to about tens of nm. The opposite electrode 150 may be electrically connected over some or all of the pixels of the organic light-emitting display device 1.

The organic light-emitting display device 1 according to an embodiment may include the third region 300, in which the auxiliary electrode 160 directly contacts the opposite electrode 150. The third region 300 may be inside the second opening 120$h$2 of the pixel-defining layer 120. For example, the third region 300 may reduce the voltage drop of the organic light-emitting display device 1 and simultaneously not reduce the aperture ratio of the organic light-emitting display device 1. Also, since the area A300 of the third region 300 is very much smaller than the area A200 of the second region 200, reduction in the transmittance of the organic light-emitting display device 1 by the third region 300 may be reduced or minimized.

Figure 5:
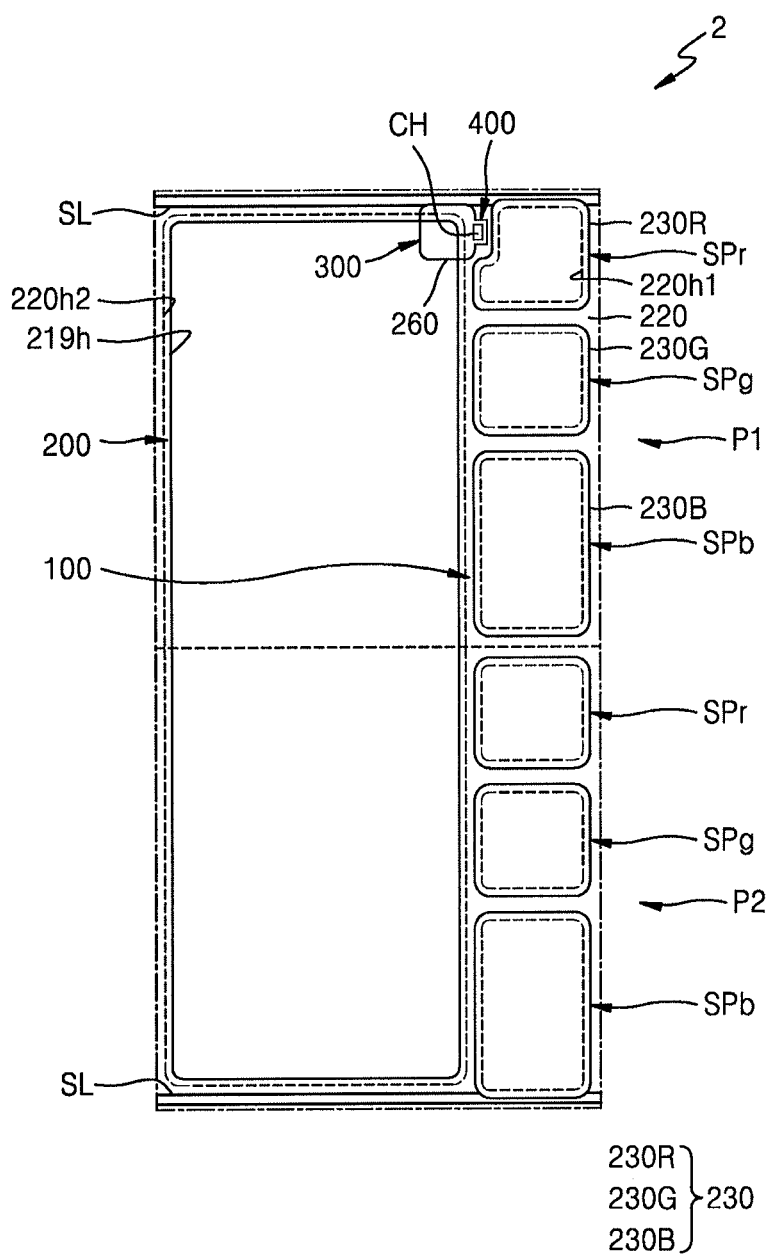
FIG. 5 illustrates an embodiment of adjacent pixels.
Figure 6:
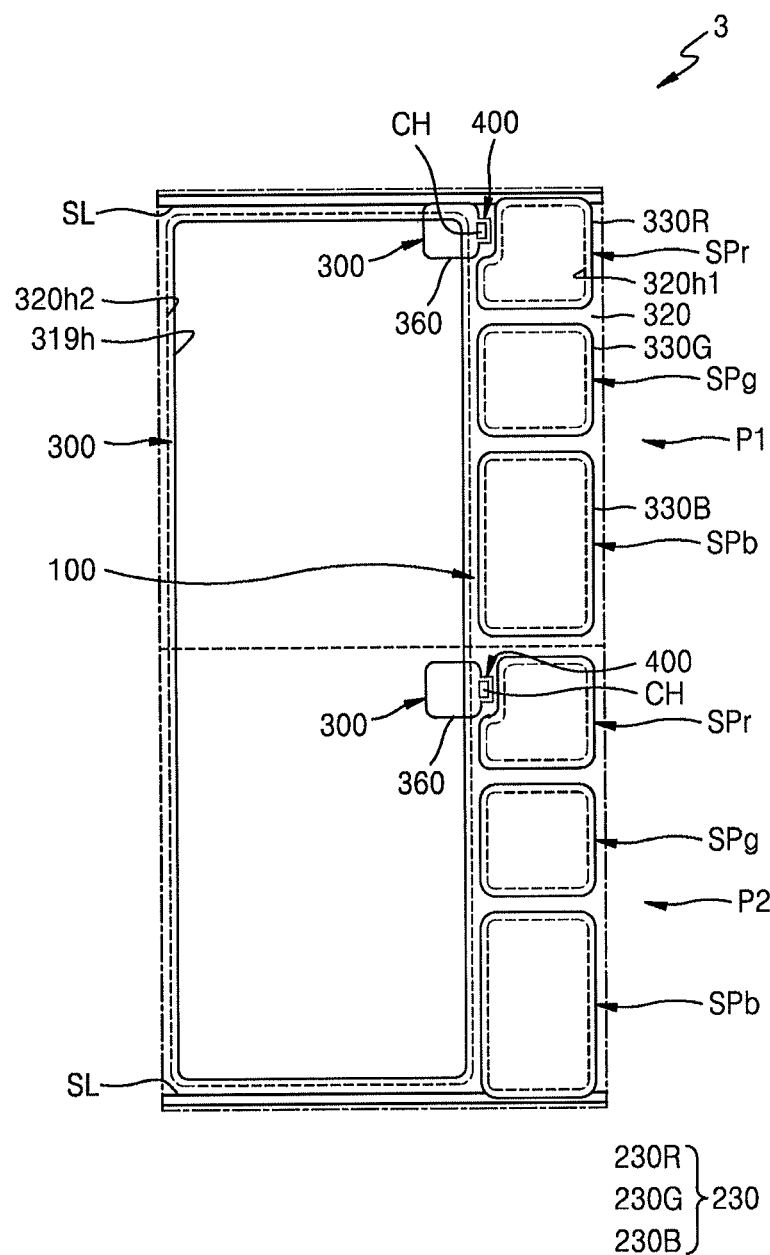
FIG. 6 illustrates another embodiment of adjacent pixels.

FIG. 5 illustrates an embodiment of adjacent pixels of an organic light-emitting display device 2. FIG. 6 illustrates another embodiment of adjacent pixels of an organic light-emitting display device 3.

Referring to FIGS. 5 and 6, the organic light-emitting display devices 2 and 3 include the substrate 10 (e.g., see FIG. 1) and the pixel P1 over the substrate 10. The pixel P1 includes the first region 100 for emitting light for displaying an image, the second region 200 for transmitting external light, and the third region 300 between the first region 100 and the second region 200.

The pixel P1 includes pixel electrodes 230 and 240 in the first region 100, pixel-defining layers 220 and 320, auxiliary electrodes 260 and 360, an intermediate layer, and an opposite electrode. The pixel-defining layers 220 and 320 include first opening 220$h$1 and 320$h$1 and second openings 220$h$2 and 320$h$2. The first opening 220$h$1 and 320$h$1 are in at least the first region 100 and expose a portion of the pixel electrodes 230 and 330. The second openings 220*h*2 and 320*h*2 correspond to at least the second region 200 and the third region 300.

The auxiliary electrodes 260 and 360 are in at least the third region 300. The intermediate layer is over the pixel electrodes 230 and 330 exposed via the first openings 220*h*1 and 320*h*1 and includes an organic emission layer. The opposite electrode is over the intermediate layer and contacts the auxiliary electrodes 260 and 360 in the third region 300.

According to an embodiment, the organic light-emitting display devices 2 and 3 include the pixel P1 and another pixel P2 adjacent to the pixel P1. The pixel P1 and the pixel P2 are respectively denoted by the first pixel P1 and the second pixel P2 below.

Each of the first pixel P1 and the second pixel P2 includes a first sub-pixel SPr, a second sub-pixel SPg, and a third sub-pixel SPb respectively emitting light of different colors. First pixel electrodes 230R and 330R, second pixel electrodes 230G and 330G, and third pixel electrodes 230B and 330B may be respectively in the first sub-pixel SPr, the second sub-pixel SPg, and the third sub-pixel SPb.

The second regions 200 of the first pixel P1 and the second pixel P2 may be connected to each other. The transmittance of the organic light-emitting display devices 2 and 3 may be increased in these embodiments. Also, clarity of an external background image passing through the second regions 200 and visible to a user may be increased by increasing the areas of the second regions 200.

According to an embodiment, the first sub-pixel SPr, the second sub-pixel SPg, and the third sub-pixel SPb may be arranged in the first direction. The scan line SL extends in the second direction crossing the first direction and may be outside the second region 200. The data line, the first power voltage line, the second power voltage line, and the compensation control line crossing the first region 100 of the first pixel P1 and the second pixel P2 may extend in the first direction. The second power voltage line may be in the first region 100 and the fourth region 400 of the first pixel P1. The second power voltage line may be connected to the auxiliary electrodes 260 and 360 via contact holes CH of the via insulating layer.

In the embodiment of FIG. 6, the second power voltage line may be in the first region 100 and the fourth region 400 of the first pixel P1 and the second pixel P2. Also, the second power voltage line may be connected to the auxiliary electrode 360 via a contact hole CH of the via insulating layer.

In the organic light-emitting display device 2 of FIG. 5, the third region 300 and the fourth region 400 may be only in the first pixel P1 (from among the first pixel P1 and the second pixel P2) adjacent to each other. The third region 300 and the fourth region 400 may not be in the second pixel P2. By the above configuration, the aperture ratio of the second pixel P2 may improve even more.

In the organic light-emitting display device 3 of FIG. 6, the third region 300 and the fourth region 400 may be in both the first pixel P1 and the second pixel P2 adjacent to each other. Through this configuration, a voltage drop of the opposite electrode may be reduced even more. For example, the third region 300 and the fourth region 400 may allow for a reduction in the voltage drop of the opposite electrode and may be arranged in all pixels or some pixels of the organic light-emitting display device.

Figure 7:
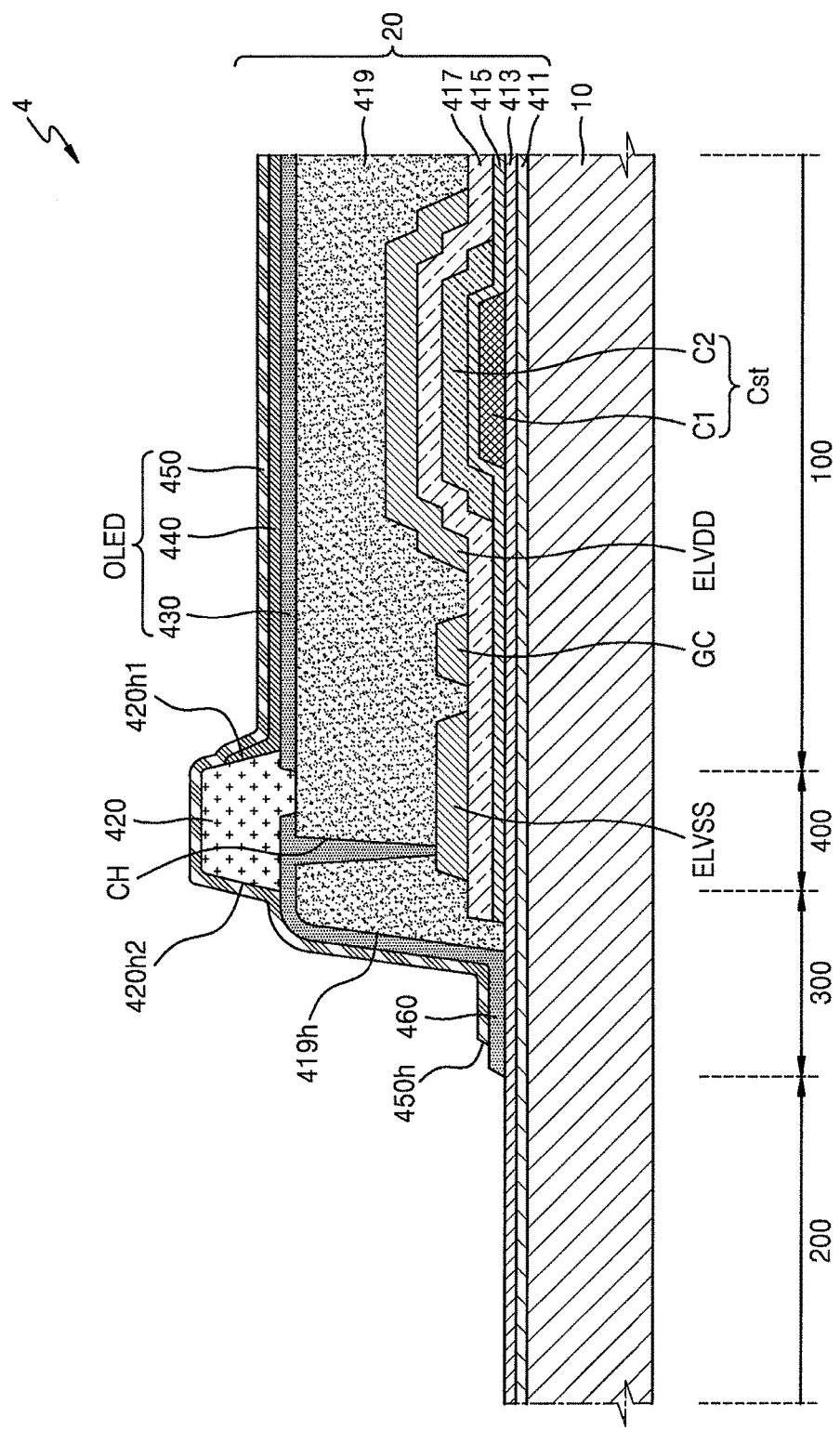
FIG. 7 illustrates another embodiment of a pixel.

FIG. 7 illustrates a cross-sectional view of an embodiment of a portion of a pixel of an organic light-emitting display device 4. Referring to FIG. 7, the organic light-emitting display device 4 includes the substrate 10 and a pixel over the substrate 10. The organic light-emitting display device includes the first region 100 to emit light for displaying an image, the second region 200 for transmitting external light, and the third region 300 between the first region 100 and the second region 200. The pixel includes a pixel electrode 430 in the first region 100, a pixel-defining layer 420, an auxiliary electrode 460 in at least the third region 300, an intermediate layer 440, and an opposite electrode 450. The pixel-defining layer 420 is in at least the first region 100 and includes a first opening 420*h*1 exposing a portion of the pixel electrode 430 and a second opening 420*h*2 corresponding to at least the second region 200 and the third region 300. The auxiliary electrode 460 is in at least the third region 300. The intermediate layer 440 is on the pixel electrode 430 exposed via the first opening 420*h*1 and may include an organic emission layer. The opposite electrode 450 is on the intermediate layer 440 and contacts the auxiliary electrode 460 in the third region 300.

The organic light-emitting display device 4 of FIG. 7 may be the same as the organic light-emitting display device 1 of FIG. 4, except for the configuration of the opposite electrode 450. The opposite electrode 450 may include an opening 450*h* corresponding to the second region 200 to improve the transmittance of the organic light-emitting display device 4 to an even greatest extent.

In one embodiment, at least one of the first common layer 142 or the second common layer 143 may be further included in the intermediate layer 440. In one or more embodiments, reference numerals 411, 413, 415, 417, 419, and 419*h* may respectively correspond to a buffer layer, a first insulating layer, a second insulating layer, a third insulating layer, a via insulating layer, and an opening of the via insulating layer. According to an embodiment, a conductive layer may correspond to the second power voltage line ELVSS or a different feature or power supply voltage line.

The embodiments of the organic light-emitting display devices 1, 2, 3, and 4 may include the third region 300, in which the auxiliary electrodes 160, 260, 360, and 460 directly contact the opposite electrodes 150 and 450. The third region 300 may be inside the second openings 120*h*2, 220*h*2, 320*h*2, and 420*h*2 of the pixel-defining layers 120, 220, 320, and 420. For example, the third region 300 may reduce a voltage drop of the organic light-emitting display devices 1, 2, 3, and 4 and simultaneously not reduce the aperture ratio of the organic light-emitting display devices 1, 2, 3, and 4. Also, since the area of the third region 300 is very much smaller than the area of the second region 200, a reduction in the transmittance of the organic light-emitting display devices 1, 2, 3, and 4 by the third region 300 may be reduced, minimized, or prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light-emitting display device, comprising:
a substrate; and
a pixel over the substrate and including a first region to display an image, a second region to transmit external light, and a third region between the first region and the second region, wherein the pixel includes:
a pixel electrode in the first region;
a pixel-defining layer in at least the first region and including a first opening and a second opening, the first opening exposing a portion of the pixel electrode and the second opening corresponding to at least the second region and the third region;
an auxiliary electrode in at least the third region; and
an intermediate layer on the pixel electrode exposed via the first opening, the intermediate layer including an organic emission layer and an opposite electrode on the intermediate layer and contacting the auxiliary electrode in the third region.

2. The display device as claimed in claim 1, wherein the opposite electrode directly contacts the auxiliary electrode exposed via the second opening of the pixel-defining layer in the third region.

3. The display device as claimed in claim 1, wherein the auxiliary electrode and the pixel electrode are in a same layer and include a same material.

4. The display device as claimed in claim 1, wherein the pixel includes:
a fourth region between the first region and the second region,
wherein the auxiliary electrode extends from the third region to at least a portion of the fourth region and wherein at least the portion of the auxiliary electrode which corresponds to the fourth region is covered by the pixel-defining layer.

5. The display device as claimed in claim 1, further comprising:
a conductive layer spaced apart from at least a portion of the auxiliary electrode in a fourth region with a via insulating layer therebetween, wherein the auxiliary electrode is connected to the conductive layer via a contact hole of the via insulating layer.

6. The display device as claimed in claim 5, wherein at least portion of the auxiliary electrode in the fourth region, at least a portion of the conductive layer, and the contact hole overlap one another.

7. The display device as claimed in claim 5, wherein at least portion of the auxiliary electrode in the fourth region is between the via insulating layer and the pixel-defining layer.

8. The display device as claimed in claim 5, wherein:
the via insulating layer includes an opening corresponding to the second region and at least a portion of the third region, and
the auxiliary electrode extends from the fourth region to the third region along an edge of the opening of the via insulating layer.

9. The display device as claimed in claim 1, wherein:
the pixel electrode is a reflective electrode, and
the opposite electrode is a transparent or semi-transparent electrode.

10. The display device as claimed in claim 1, wherein a ratio of an area of the second region to an entire area of the pixel is about 40% to about 90%.

11. The display device as claimed in claim 1, wherein a ratio of an area of the third region to an area of the second region is about 0.5% or less.

12. The display device as claimed in claim 1, further comprising:
a driver in the first region and electrically connected to the pixel electrode, wherein the driver is to drive the pixel and includes at least one thin film transistor and at least one capacitor.

13. The display device as claimed in claim 12, wherein:
the at least one capacitor includes an upper electrode facing a lower electrode and an insulating layer therebetween, and
a via insulating layer covers the upper electrode.

14. The display device as claimed in claim 1, wherein:
the intermediate layer includes a common layer,
the common layer is over an entire region of the pixel, except at least a portion of the third region of the pixel.

15. The display device as claimed in claim 1, wherein:
the pixel includes a first sub-pixel, a second sub-pixel, and a third sub-pixel to respectively emit light of different colors, and
the pixel electrode includes a first pixel electrode, a second pixel electrode, and a third pixel electrode respectively arranged in the first sub-pixel, the second sub-pixel, and the third sub-pixel in a form of an island.

16. The display device of claim 15, wherein:
the first sub-pixel, the second sub-pixel, and the third sub-pixel are to respectively emit red light, green light, and blue light, and
the first sub-pixel, the second sub-pixel, and the third sub-pixel respectively have different areas.

17. The display device of claim 16, wherein the third region is adjacent to a pixel electrode having a smallest area from among the first pixel electrode, the second pixel electrode, and the third pixel electrode.

18. An organic light-emitting display device, comprising:
a substrate; and
a pixel over the substrate and including a first region to display an image, a second region to transmit external light, a third region between the first region and the second region, and a fourth region between the first region and the third region, wherein the pixel includes:
a pixel electrode in the first region;
a pixel-defining layer in at least the first region and including a first opening and a second opening, the first opening exposing a portion of the pixel electrode and the second opening corresponding to at least the second region and the third region;
an auxiliary electrode in the third region and the fourth region;
a conductive layer in the fourth region, spaced apart from the auxiliary electrode with a via insulating layer therebetween, and connected to the auxiliary electrode via a contact hole of the via insulating layer; and
an intermediate layer on the pixel electrode exposed via the first opening, the intermediate layer including an organic emission layer and an opposite electrode on the intermediate layer and contacting the auxiliary electrode exposed via the second opening in the third region.

19. The display device of claim 18, wherein a portion of the auxiliary electrode corresponding to the fourth region is between the via insulating layer and the pixel-defining layer.

20. The organic light-emitting display device of claim 18, wherein:
the via insulating layer includes an opening corresponding to the second region and at least a portion of the third region, and the auxiliary electrode extends from the fourth region to the third region along an edge of the opening of the via insulating layer.

\* \* \* \* \*